(12) United States Patent
Otani et al.

(10) Patent No.: US 8,974,648 B2
(45) Date of Patent: Mar. 10, 2015

(54) REACTIVE SPUTTERING METHOD AND REACTIVE SPUTTERING APPARATUS

(75) Inventors: Yuichi Otani, Tama (JP); Takashi Nakagawa, Hachioji (JP)

(73) Assignee: Canon Anelva Corporation, Kawasaki-shi (JP)

( * ) Notice: Subject to any disclaimer, the term of this patent is extended or adjusted under 35 U.S.C. 154(b) by 288 days.

(21) Appl. No.: 12/974,923

(22) Filed: Dec. 21, 2010

(65) Prior Publication Data

US 2011/0155561 A1 Jun. 30, 2011

(30) Foreign Application Priority Data

Dec. 26, 2009 (JP) ................................. 2009-296538

(51) Int. Cl.
*H01J 37/34* (2006.01)
*C23C 14/00* (2006.01)
(Continued)

(52) U.S. Cl.
CPC ......... *C23C 14/0042* (2013.01); *H01J 37/3438* (2013.01); *H01J 37/3447* (2013.01); *C23C 14/088* (2013.01); *C23C 14/544* (2013.01)
USPC .............. 204/298.11; 204/298.12; 204/192.1; 204/192.2; 427/8; 257/761

(58) Field of Classification Search
CPC .................................................. C23C 14/0042
USPC .................................................. 204/298.11
See application file for complete search history.

(56) References Cited

U.S. PATENT DOCUMENTS

| 6,171,641 B1 * | 1/2001 | Okamoto et al. .................. 427/8 |
| 2005/0199490 A1 * | 9/2005 | Nomura et al. .......... 204/298.11 |

(Continued)

FOREIGN PATENT DOCUMENTS

| JP | 5-21382 A | 1/1993 |
| JP | 5-175157 A | 7/1993 |

(Continued)

OTHER PUBLICATIONS

Z. Wei et al., "Highly Reliable TaO$_x$ ReRAM and Direct Evidence of Redox Reaction Mechanism," International electron devices meeting technical digest, pp. 293-296 (2008).

(Continued)

*Primary Examiner* — Keith Hendricks
*Assistant Examiner* — Timon Wanga
(74) *Attorney, Agent, or Firm* — Fitzpatrick, Cella, Harper & Scinto

(57) ABSTRACT

The present invention provides a reactive sputtering method and a reactive sputtering apparatus which suppress a film quality change caused by a temperature variation in continuous substrate processing. An embodiment of the present invention performs reactive sputtering while adjusting a flow rate of reactive gas according to the temperature of a constituent member facing a sputtering space. Specifically, a temperature sensor is provided on a shield and the flow rate is adjusted according to the temperature. Thereby, even when a degassing amount of a film adhering to the shield changes, a partial pressure of reactive gas can be set to a predetermined value. For a resistance change layer constituting a ReRAM, a perovskite material such as PrCaMnO3 (PCMO), LaSrMnO3 (LSMO), and GdBaCoxOy (GBCO), a two-element type transition metal oxide material which has a composition shifted from a stoichiometric one, such as nickel oxide (NiO), vanadium oxide (V2O5), and the like are used.

2 Claims, 7 Drawing Sheets

(51) Int. Cl.
　　　*C23C 14/08*　　　(2006.01)
　　　*C23C 14/54*　　　(2006.01)

(56) References Cited

U.S. PATENT DOCUMENTS

| | | | |
|---|---|---|---|
| 2007/0084717 A1* | 4/2007 | Nagashima | 204/192.2 |
| 2007/0215463 A1* | 9/2007 | Parkhe | 204/298.12 |
| 2009/0273087 A1* | 11/2009 | French et al. | 257/761 |
| 2010/0078309 A1* | 4/2010 | Ueda et al. | 204/192.1 |
| 2010/0243438 A1* | 9/2010 | Yamaguchi et al. | 204/298.11 |

FOREIGN PATENT DOCUMENTS

| | | |
|---|---|---|
| JP | 5-179436 A | 7/1993 |
| JP | 8-130302 A | 5/1996 |
| JP | 2003-7644 A | 1/2003 |
| JP | 2008-240093 A | 10/2008 |

OTHER PUBLICATIONS

H. Y. Lee et al., "Low Power and High Speed Bipolar Switching with a Thin Reactive Ti Buffer Layer in Robust $HfO_2$ Based RRAM," International electron devices meeting technical digest, pp. 297-300 (2008).

Seo, et al., "Conductivity switching characteristics and reset currents in NiO films", Appl. Phys. Lett. 86, 093509 (2005).

International electron devices meeting technical digest, 2008, pp. 293-296.

International electron devices meeting technical digest, 2008, pp. 297-300.

Symposium on VLSI technology digest of technical papers, 2009, pp. 30-31.

Office Action issued in Japanese Patent Application No. 2010-253640, dated Mar. 10, 2014 (4 pgs.).

* cited by examiner

REACTIVE SPUTTERING METHOD AND REACTIVE SPUTTERING APPARATUS

BACKGROUND OF THE INVENTION

1. Field of the Invention

The present invention relates to a reactive sputtering method and a reactive sputtering apparatus which provide an excellent film quality stability.

2. Description of the Related Art

For realizing a highly functional digital device, it is indispensable to develop a memory to be used having a higher capacity, a higher speed, a lower power consumption, a longer lifetime, and the like. Especially, a flash memory is used for various applications and expected to have a further higher performance. However, a flash memory using a floating gate, which is mainstream at present, has a problem that a threshold voltage variation is caused by interference through a capacitive coupling between memory cells neighboring each other along with miniaturization of the memory cell and it is generally known that there exists a limit for the miniaturization.

Hence, a device drawing attention for replacing the flash memory is a ReRAM which is provided with a metal oxide and has a recording principle suitable for the miniaturization. ReRAM is an abbreviation of Resistivity Random Access Memory, and the ReRAM is a nonvolatile memory which can be caused to change a state (specifically, resistance value) of metal oxide with a pulse voltage and can preserve the information unless a pulse voltage is applied again. Further, the ReRAM can reduce cost utilizing the simplicity of the device structure and operation, and is considered to be operated even in an order of 50 ns or less, and thereby various ideas are being proposed using this device.

For the resistance change layer of the ReRAM, there are used a perovskite material such as $PrCaMnO_3$ (PCMO), $LaSrMnO_3$ (LSMO) and $GdBaCo_xO_y$ (GBCO), and a two-element type transition metal oxide material which has a composition shifted from a stoichiometric one, such as nickel oxide (NiO), vanadium oxide ($V_2O_5$), zinc oxide (ZNO), niobium oxide ($Nb_2O_5$), titanium oxide ($TiO_2$), cobalt oxide (CoO), tantalum oxide ($Ta_2O_5$) and tungsten oxide ($WO_2$).

A means for fabricating a metal compound such as the metal oxide layer and the like includes reactive sputtering which performs sputtering of a metal target using reactive gas such as oxygen gas and nitrogen gas, and the process having an extinguished controllability and reproducibility is considered to be required for the production.

When performing continuous film deposition using the reactive sputtering, however, there arises a problem that a film characteristic is different for each processing. This phenomenon is shown in FIG. 8. The data of FIG. 8 shows a specific resistance change of a film (here, Ta oxide) deposited on a substrate against the number of times of processing when the processing is performed by oxygen reactive sputtering of a metal target Ta using a DC magnetron sputtering apparatus. This data shows that the specific resistance increases as the number of times of processing increases and it is found that the specific resistance increases in 26% from the first time to the 50th time.

The cause of the specific resistance increase includes that an oxygen gas amount taken-in (gettered) by a metal compound adhering to a shield provided in a sputtering apparatus changes depending on a case. The reason that the amount of gettered oxygen gas changes is considered to be a temperature change of the shield. The surface temperature of the shield is low while the number of times of processing is small and a degassing amount (ejected gas amount) from the metal compound adhering to the shield is small, and thereby the oxygen gettering effect is large in the metal compound. On the other hand, as the number of times of processing increases, the shield accumulates plasma heat and the shield temperature increases due to the accumulated heat, and then the degassing amount increases. The oxygen gettering effect decreases gradually as this degassing amount increases, resulting in the increase of the specific resistance along with the increase of the number of times of processing.

As a means for suppressing the change of the reactivity for each number of times of processing, there is a method of performing a dummy run before the continuous processing for a sufficiently long time until the shield comes to have a temperature which is to be reached during the sputtering process. This method, however, results in a shorter target shield life and a reduced throughput, and does not provide a sufficiently effective countermeasure.

Further, Japanese Patent Laid-Open No. H5-175157 proposes to heat the shield (200° C. to 500° C.) preliminarily using heater heating, gas heating or the like. This proposal intends to stabilize the reactivity by realizing a thermal equilibrium state preliminarily within a sputtering chamber and to suppress a thermal variation during the sputtering process. However, the inside of the chamber is heated to 200° C. or more and thereby the deposition cannot be carried out in a sufficiently cooled atmosphere and further it takes a long time until the shield surface reaches a thermal equilibrium similarly to the above case. Further, when using a material in which a crystal state changes between at a low temperature and at a high temperature such as Al oxide (γ-alumina, α-alumina, or the like) or a material which forms various coupling states with oxygen such as Ta oxide ($TaO_2$, $Ta_2O_5$, or the like), it is difficult to control the reaction precisely in the film deposition by the above method.

SUMMARY OF THE INVENTION

The present invention aims at providing a reactive sputtering method and a reactive sputtering apparatus which are capable of suppressing a film quality variation as described above in continuous film deposition of reactive sputtering without losing a target shield life or a throughput.

First aspect of the present invention is a reactive sputtering method of sputtering a target disposed in a film deposition processing chamber, supplying reactive gas into the film deposition processing chamber, and forming a deposited film on a to-be-processed substrate disposed in the film deposition processing chamber by reactive sputtering, the method comprising the steps of: measuring a temperature of a constituent member which is provided in the film deposition processing chamber and faces a sputtering space; and performing the reactive sputtering while adjusting a flow rate of the reactive gas according to a rise of the measured temperature so as to reduce the flow rate of the reactive gas supplied into the film deposition processing chamber.

Second aspect of the present invention is a reactive sputtering apparatus forming a deposited film on a to-be-processed substrate by reactive sputtering, the apparatus comprising: a container; an electrode which is provided in the container and to which a target can be attached; a substrate holder which is provided in the container and can hold the to-be-processed substrate; a shield which is provided in the container and disposed so as to face a sputtering space in the reactive sputtering; a reactive gas introduction means for introducing reactive gas into the container; a temperature sensor capable of measuring a temperature of the shield; and controller controlling the reactive gas introduction means according to an output of the temperature sensor so as to reduce a flow rate of the reactive gas supplied into the container according to a rise in the temperature of the shield.

Thereby, it is possible to control a partial pressure of the reactive gas (e.g., oxygen partial pressure) according to the temperature and it is possible to secure the stability in the continuous film deposition while reducing the influence of the degassing amount from the constituent member within the vacuum container.

According to the present invention, it becomes possible to suppress the variation of the film characteristic depending on the number of times of processing in the continuous film deposition of the reactive sputtering without losing the target shield life and the throughput.

DETAILED DESCRIPTION OF THE INVENTION

Figure 1:
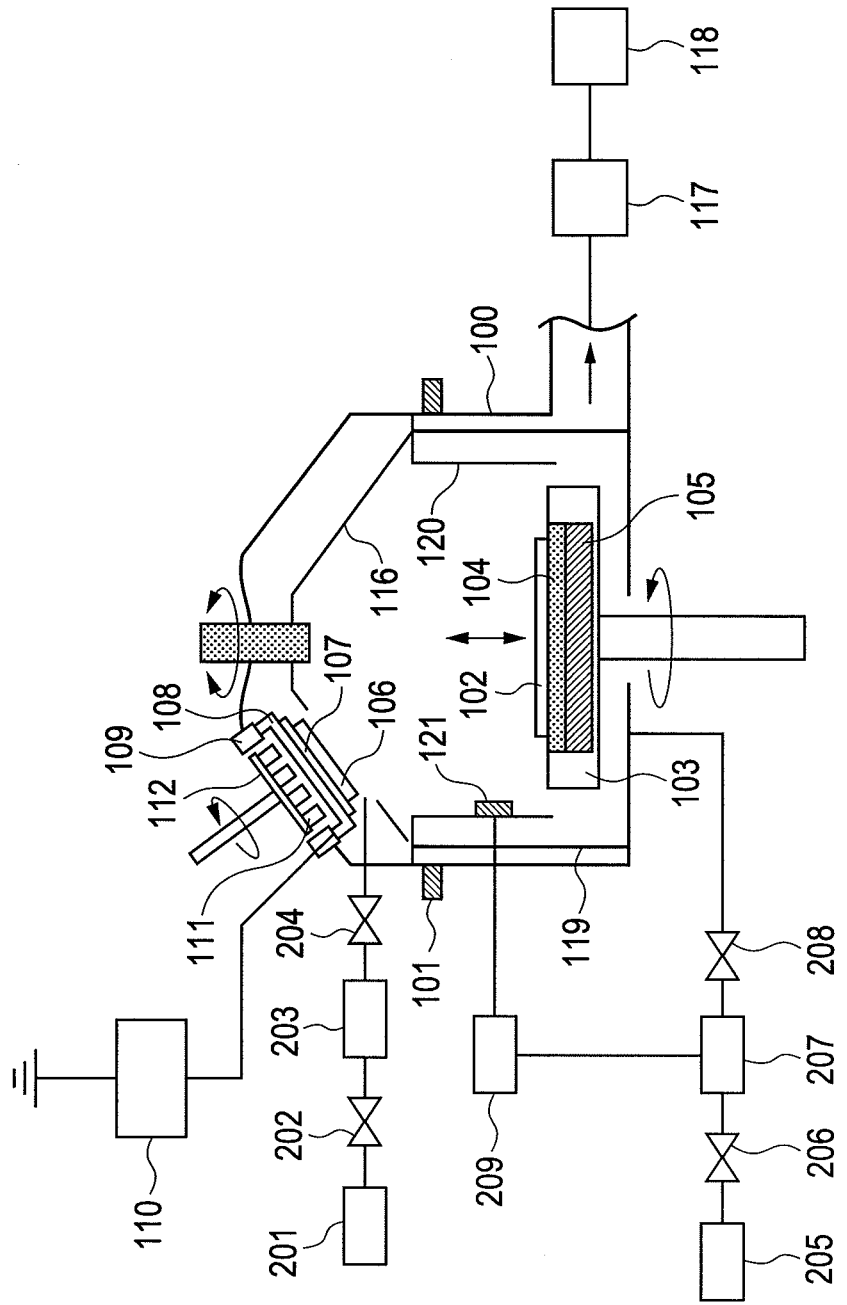
FIG. 1 is a diagram showing an outline of a processing apparatus which suppresses the variation of a specific resistance in reactive sputtering, according to a first embodiment of the present invention.

Hereinafter, with reference to the drawings, there will be explained a continuous film deposition method of the reactive sputtering which suppresses a film characteristic variation using the present invention. Note that an element having the same function is denoted by the same reference numeral in the drawing to be explained hereinafter and repeated explanation thereof will be omitted.

First Embodiment

FIG. 1 is a schematic diagram of a sputtering apparatus suitable for implementing a method of the present embodiment. A film deposition processing chamber 100 is configured so as to be heated to a predetermined temperature by a heater 101. Further, the film deposition processing chamber (container) 100 is configured such that a to-be-processed substrate 102 is heated to a predetermined temperature by a heater 105 via a susceptor 104 embedded in a substrate holder 103. The substrate holder 103, which is a substrate holder capable of holding the substrate, preferably can rotate at a predetermined rotating speed from the viewpoint of film thickness uniformity. In the film deposition processing chamber, a target 106 is disposed at a position facing the to-be-processed substrate 102. The target 106 is disposed at a target holder 108 via a back plate 107 made of metal such as Cu. Note that a form of target assembly combining the target 106 and the back plate 107 may be fabricated as a component by the use of target material and this form may be attached as the target. That is, the target may be configured to be disposed directly on the target holder.

The target holder 108 made of metal such as Cu is connected with a DC power source 110 applying sputtering discharge power and insulated from the wall of the film deposition processing chamber 100, which has a ground potential, by an insulator 109. Behind the target 106, when viewed from the sputtering surface, there is disposed a magnet 111 for realizing magnetron sputtering. The magnet 111 is held by a magnet holder 112 and can be rotated by a magnet holder rotation mechanism which is not shown in the drawing. For uniform erosion of the target, the magnet 111 is rotated during the discharge. The target 106 is disposed at an offset position obliquely upward from the substrate 102. That is, the center point of the sputtering surface on the target 106 is located at a position shifted by a predetermined dimension from the normal line at the center point of the substrate 102. A shield plate 116 is disposed between the target 106 and the to-be-processed substrate 102 and controls the film deposition onto the to-be-processed substrate 102 with sputtered particles ejected from the target 106 to which power is supplied. The sputtering is performed when the power is supplied to the metal target 106 respectively via the target holder 108 and the back plate 107 from the DC power source 110.

At this time, an inert gas is introduced into the processing chamber 100 at a position around the target from an inert gas source 201 via a valve 202, a mass flow controller 203, and a valve 204. Further, a reactive gas is introduced into the processing chamber 100 at a position around the substrate from a reactive gas source 205 via a valve 206, a mass flow controller 207, and a valve 208. Accordingly, the reactive gas source 205, the valve 206, the mass flow controller 207, and the valve 208 function as a mechanism involved in the reactive gas introduction. The introduced inert gas and reactive gas are exhausted by an exhaust pump 118 via a conductance valve 117. A shield 120 having a shape surrounding a processing space is disposed via a shield support rod 119 for preventing or reducing film adhesion to the side wall of the film deposition processing chamber during the sputtering. The shield 120 is disposed so as to face the sputtering space at a position surrounding the sputtering space formed in the film deposition processing chamber 100.

On the side wall of the shield 120 (to-be-processed substrate side of the shield 120), there is provided a shield temperature sensor 121 which has a thermocouple or the like capable of measuring the temperature of the shield 120 (hereinafter, also called "shield temperature"). Note that, while the shield temperature sensor 121 is preferably attached on the side of the to-be-processed substrate 102 for accurately obtaining the temperature change in a constituent member of the substrate periphery (member except the to-be-processed substrate 102 and constituent member provided in the film deposition processing chamber), the shield temperature sensor 121 may be attached to a position such as the rear side of the shield 120 where the film is not deposited from the viewpoint of apparatus operation. Further, the shield temperature sensors 121 may be provided at plural positions of the shield 120, and a shield temperature to be used for the control (a degassing amount or a reactive gas partial pressure) may be calculated, for example, by the use of an average temperature of the temperatures at the plural positions or weighting of temperature data when the shield temperature sensors 121 are provided at positions where the film is easily deposited and not easily deposited, respectively. Further, the shield temperature may be estimated by providing the sensor on a member around the shield without providing it directly on the shield.

A reactive gas control mechanism 209 which feedbacks an output from the shield temperature sensor 121 is configured to control the mass flow controller 207.

Figure 2:
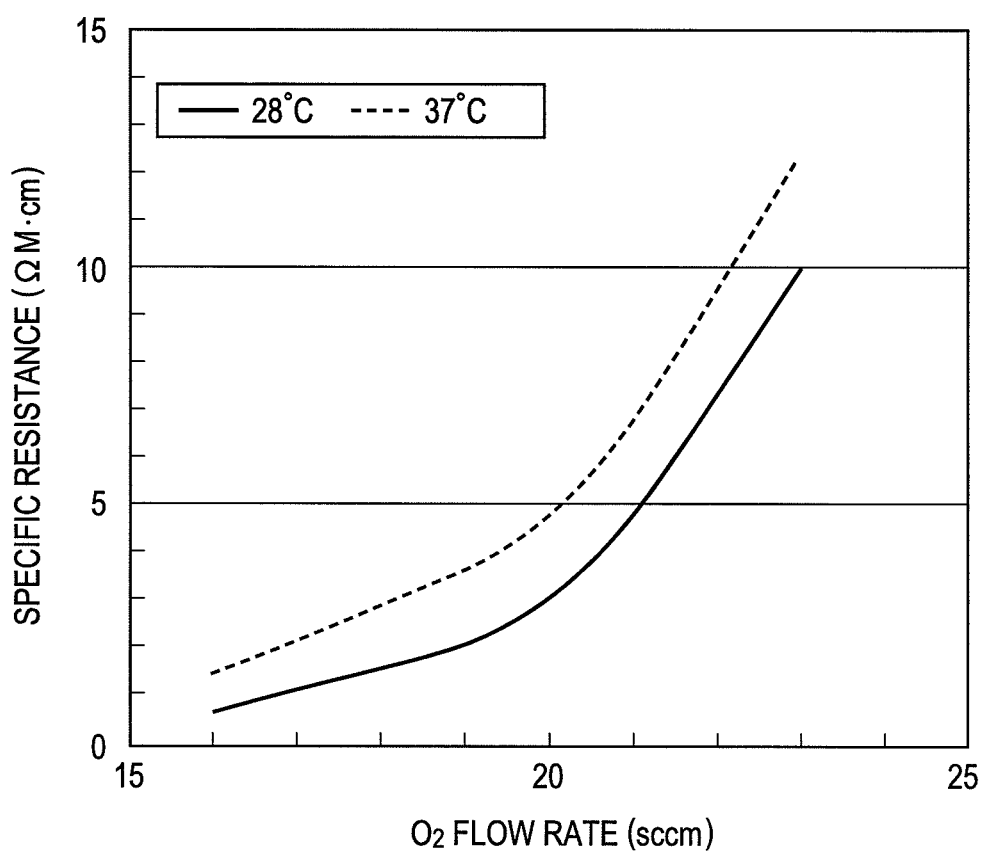
FIG. 2 is a graph showing a specific resistance characteristic against an oxygen flow rate at each shield temperature, in a first embodiment of the present invention.

The reactive gas control mechanism 209 stores a relationship of a specific resistance of a film (film to be deposited), which is deposited on the to-be-processed substrate 102 with particles sputtered from the target 106 provided in the film deposition processing chamber 100 and the reactive gas, against a reactive gas flow rate at each shield temperature in a preliminarily defined map, as shown in FIG. 2, for example. FIG. 2 shows the specific resistance characteristic against an oxygen flow rate at each temperature obtained when the reactive gas flow rate is changed in each film deposition at a constant temperature and the specific resistance is measured in each deposited film. The example of FIG. 2 shows a result measured at each of shield temperatures, 28° C. and 37° C., for a case of using oxygen as a reactive gas and Ta as a target material. It is found that the specific resistance against the oxygen flow rate becomes higher at a higher temperature by the influence of the degas from the metal compound adhering to the shield 120.

That is, the present embodiment measures the specific resistance of a deposited film at each reactive gas flow rate when the reactive gas flow rate is changed within a predetermined range for various temperatures at each number of times of processing. Accordingly, when the continuous processing is to be carried out 100 times, for example, an oxygen flow rate (reactive gas flow rate) and the specific resistance of a deposited film are obtained as shown in FIG. 2 preliminarily at each temperature within a predetermined range for each of the number of times of processing 1 to 100, and the data showing the relationship is stored as a map in the reactive gas control mechanism 209. Accordingly, the reactive gas control mechanism 209 can obtain the relationship between the reactive gas flow rate and the specific resistance of the deposited film corresponding to a temperature detected by the shield temperature sensor 121 in the current number of times of processing.

The reactive gas control mechanism 209 calculates a reactive gas flow rate for obtaining a predetermined specific resistance using the above map and the shield temperature data from the shield temperature sensor 121 (e.g., shield temperature at each film deposition start), and controls the reactive gas flow rate to become the calculated flow rate via the mass flow controller. Note that the information used for controlling the reactive gas flow rate based on the shield temperature in the reactive gas control mechanism 209 is not limited to that shown in FIG. 2. For example, the relationship between the reactive gas flow rate and the specific resistance of the deposited film may be defined at more temperature zones. Alternatively, when a desired specific resistance value has been determined, only a correspondence between the shield temperature and the reactive gas flow rate may be defined or the reactive gas flow rate may be obtained by a calculation formula or the like which defines the relationship between the shield temperature and the reactive gas flow rate. Further, it is optional to control the reactive gas flow rate according to the degassing amount or the reactive gas partial pressure estimated from the shield temperature. Further, while the reactive gas flow rate is controlled basically such that the reactive gas partial pressure becomes constant for each substrate processing, the target reactive gas partial pressure itself may be varied.

In this manner, since the degassing amount of the metal compound adhering to the shield 120 changes and the reactivity is varied on the to-be-processed substrate according to the temperature of shield 120, it is possible to obtain the film characteristic of a desired specific resistance without receiving the influence of the degassing amount variation caused by the thermal variation of the film deposition processing chamber 100, by the feedback of the specific resistance data against the reactive gas flow rate preliminarily obtained at each shield temperature zone.

The present embodiment performs the reactive sputtering while adjusting the reactive gas flow rate so as to reduce the flow rate of reactive gas supplied into the film deposition processing chamber 100 according to the temperature rise of the shield 120. That is, the present embodiment forms a desired deposited film on the to-be-processed substrate 120 by adjusting the reactive gas flow rate so that the reactive gas partial pressure (e.g., oxygen partial pressure when the reactive gas is oxygen) in the film deposition processing chamber 100 (in the container) falls within a predetermined range according to the temperature of the shield 120 while monitoring the temperature of the shield 120. Specifically, the reactive gas control mechanism 209, as the result of monitoring, controls the mass flow controller 207 so as to reduce the reactive gas flow rate when the shield temperature is high and to increase the reactive gas flow rate when the shield temperature is low. Accordingly, even when the temperature of the metal compound adhering to the shield 120 is changed because of the shield temperature change and the degassing amount of the adhering metal compound changes, it is possible to control the supply of the reactive gas (e.g., oxygen) so as to compensate the variation of the reactive gas partial pressure (e.g., oxygen partial pressure) caused by the degassing amount change in the film deposition processing chamber 100. For example, even when the shield temperature is increased to T1 and the oxygen gettering effect of the adhering metal compound is reduced by the increased degassing amount, the reactive gas flow rate for the temperature T1 is reduced compared to the reactive gas flow rate for a temperature T2 which is lower than the temperature T1. Thereby, it is possible to make the reactive gas partial pressure in the film deposition processing chamber 100 approximately the same between the temperature T1 and the temperature T2. That is, even when the shield temperature changes, it is possible to select the reactive gas flow rate which realizes a desired specific resistivity of the deposited film at the shield temperature and it is possible to always keep a reactive gas partial pressure (e.g., oxygen partial pressure) so as to obtain the desired specific resistivity of the deposited film. Accordingly, even when the shield temperature is changed and thereby the degassing amount is changed by the continuous film deposition of the reactive sputtering, the variation of the reactivity between the reactive gas and the sputtered particles can be reduced on the to-be-processed substrate 102 and the variation in the specific resistivity of the deposited film can be reduced.

Meanwhile, it is important in the present embodiment to reduce the variation of the reactive gas partial pressure in the film deposition processing chamber 100 caused by degassing amount variation of a member which faces the sputtering space and on which the metal compound is formed with the sputtered particles generated from the target 106 by the reactive sputtering (hereinafter, also called "adhesive member") among constituent members except the to-be-processed substrate 102 in the film deposition processing chamber, the degassing amount variation being generated from the temperature change of the adhesive member. The degassing amount varies according to the temperature of the adhesive member, and thereby the present embodiment measures the temperature of the adhesive member and controls the reactive gas flow rate according to the temperature of the adhesive member in order to make the reactive gas partial pressure constant in the film deposition processing chamber 100.

In this manner, in the present embodiment, it is not essential how to select the kind of the reactive gas or how to determine the flow rate, but it is essential how to set the reactive gas partial pressure within an allowable range in the film deposition processing chamber 100. Accordingly, the materials of reactive gas and target are not limited to oxygen and Ta, respectively, and any reactive gas and any material may be used.

Further, the present embodiment focuses on the degassing amount of the metal compound which is originated in the sputtered particles from the target 106 when the adhesion member faces the sputtering space, but does not focus on where the metal compound is formed. Accordingly, the adhesive member is not limited to the shield 120 and any constituent member facing the sputtering space may be selected. In this case, the temperature of the selected member may be measured and the reactive gas flow rate may be controlled according to the measured temperature.

Second Embodiment

Next, a second embodiment will be explained.

Figure 3:
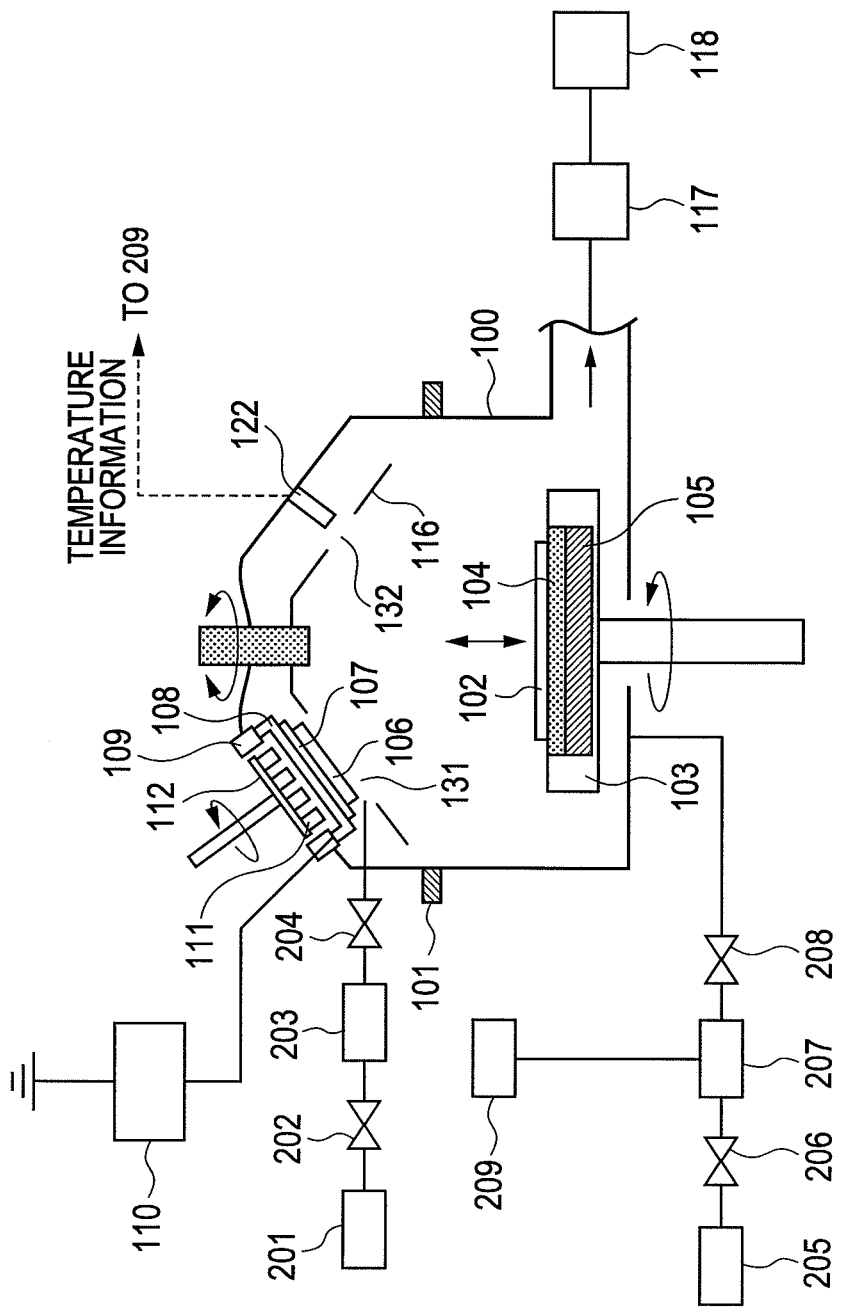
FIG. 3 is a diagram showing a reactive sputtering apparatus according to a second embodiment of the present invention.

FIG. 3 shows a reactive sputtering apparatus according to the second embodiment. While the reactive sputtering apparatus of the second embodiment has approximately the same configuration as that of the reactive sputtering apparatus in the first embodiment, a different point is that the reactive sputtering apparatus of the second embodiment does not have the shield 120 but uses a radiation thermometer 122 monitoring the strength of infrared light and visible light. Further, a shield plate 116 has not only a through hole 131 facing a target 106 but also a through hole (opening) 132 facing the radiation thermometer 122, and a space around a substrate can be observed via the through hole 132. That is, the radiation thermometer 122 is a member around a to-be-processed substrate 102 except the to-be-processed substrate 102 and is configured to measure the temperature of a member (adhesive member) facing the sputtering space via the through hole 132. The through hole 132 for the radiation thermometer 122 is formed to be smaller than the through hole for the target 106 for preventing or reducing the adhesion of the sputtered particles.

A reactive gas control mechanism 209 calculates a required reactive gas flow rate based on temperature information input from the radiation thermometer 122 and controls the reactive gas flow rate to become the calculated value. While a measurement timing is not limited particularly, it is preferable to perform the measurement in the interim of the film deposition because the temperature around the substrate can be measured accurately in the case of using the radiation thermometer 122.

In this manner, by using the radiation thermometer, it is possible to measure the temperature of the constituent member around the substrate without depending on a configuration of the apparatus and it is possible to accurately estimate the reactive gas partial pressure around the substrate which particularly affects the film deposition characteristic.

Note that obviously the present embodiment may use the radiation thermometer together with another temperature sensor.

Third Embodiment

Figure 4A:
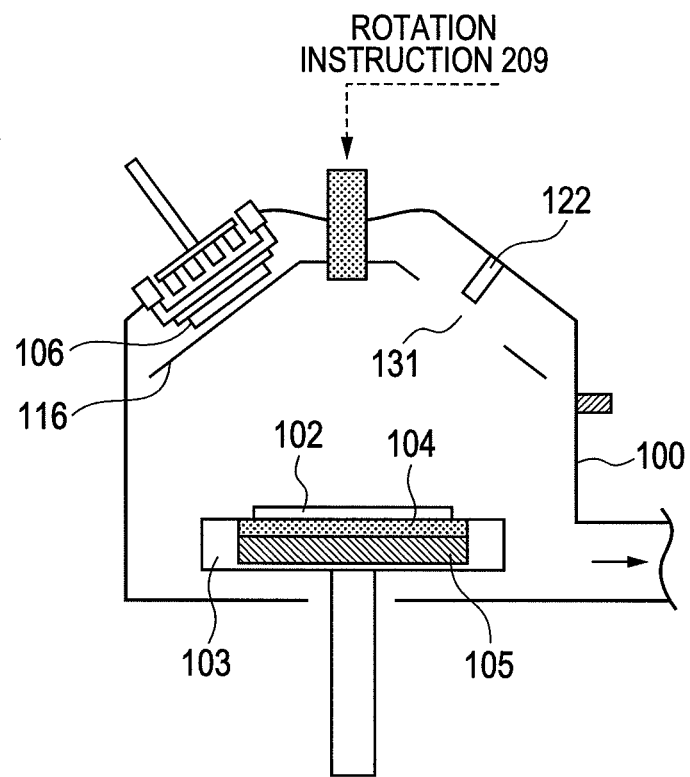
FIG. 4A is a diagram showing a reactive sputtering apparatus according to a third embodiment of the present invention.

Next, a third embodiment will be explained with reference to FIGS. 4A and 4B. While a reactive sputtering apparatus of the third embodiment has approximately the same configuration as that according to the second embodiment, a different point is a configuration of a shield plate 116. In the third embodiment, the shield plate 116 is provided with a through hole 131 having approximately the same diameter as that of a target 106 and configured to be rotatable according to an instruction from a reactive gas control mechanism 209, and thereby the through hole 131 can be moved by the rotation to respective positions facing a radiation thermometer 122 and the target 106.

Figure 4B:
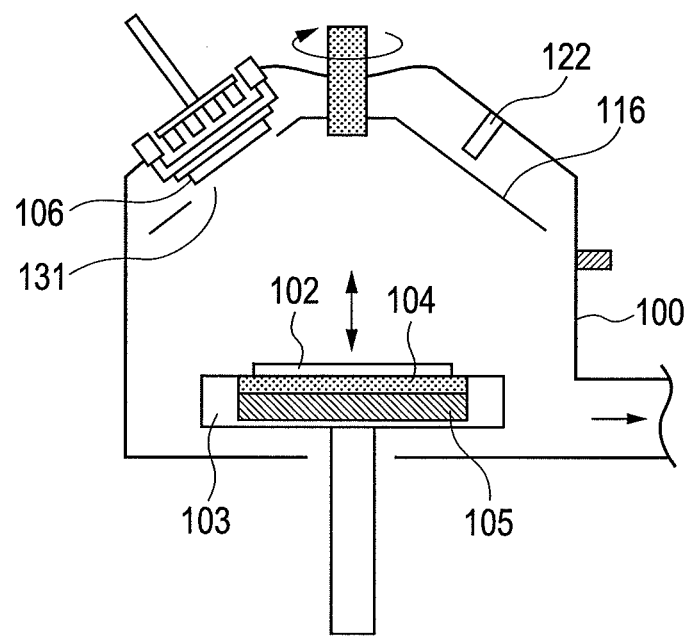
FIG. 4B is a diagram showing a reactive sputtering apparatus according to a third embodiment of the present invention.

In the interim of film deposition (e.g., after film deposition or before film deposition), the through hole 131 is caused to face the radiation thermometer 122 for enabling temperature measurement (FIG. 4A) and also, during the film deposition, the through hole 131 is moved to the position facing the target 106 and the film deposition is carried out (FIG. 4B). In the present embodiment, the shield plate 116 is provided with the through hole 131 which allows the sputtered particles to pass through, and thereby the target 106 is opened to the sputtering space via the through hole 131 when the through hole 131 faces the target 106 and the radiation thermometer 122 is opened to the sputtering space via the through hole 131 when the through hole 131 faces the radiation thermometer 122. With such a configuration, the through hole 131 can be utilized when the target is not used in the interim of film deposition, and also the radiation thermometer 122, which is not used during the film deposition, can be covered with the shield plate 116. Thus, it is possible to effectively prevent the generation of particles and the like toward the radiation thermometer 122.

Fourth Embodiment

Next, a fourth embodiment will be explained.

Figure 5:
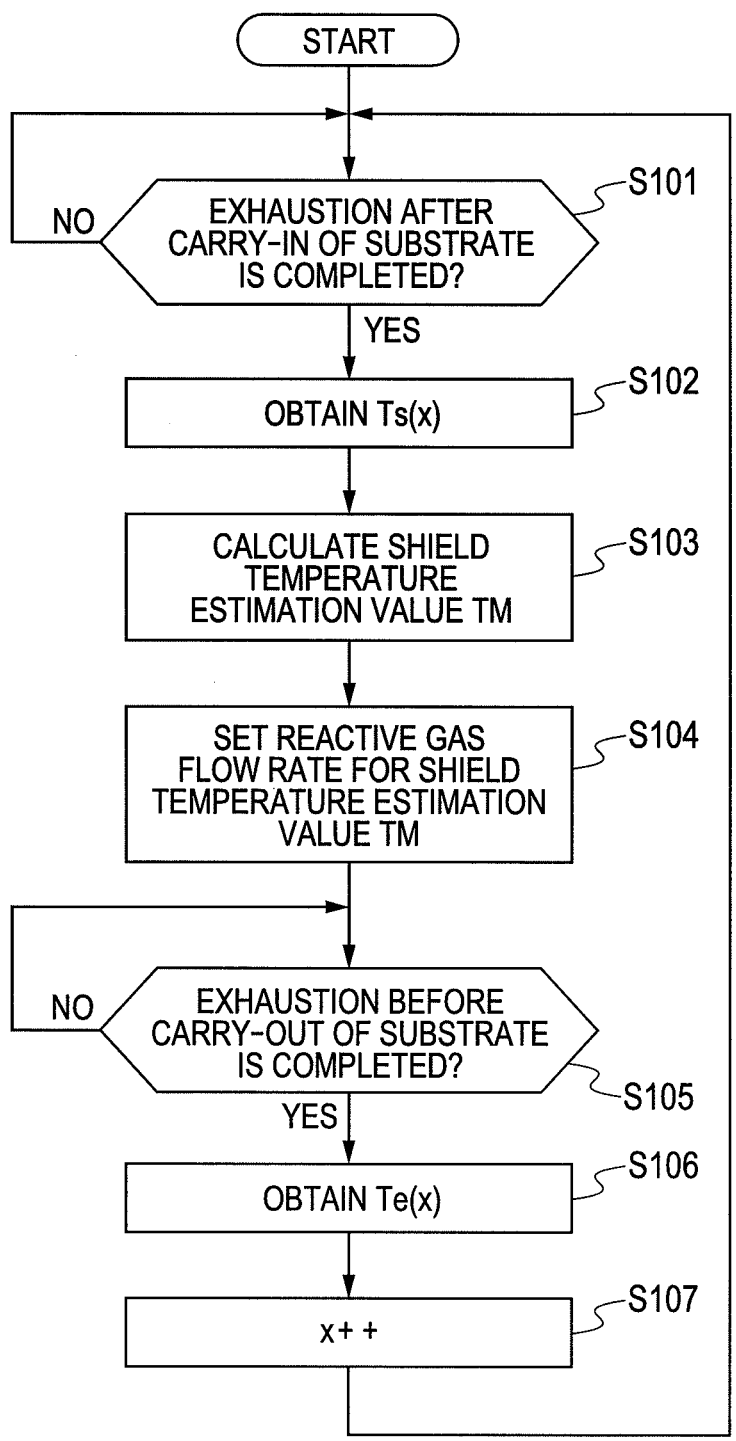
FIG. 5 is a flowchart showing the operation of a reactive gas control mechanism in a fourth embodiment of the present invention.
Figure 6:
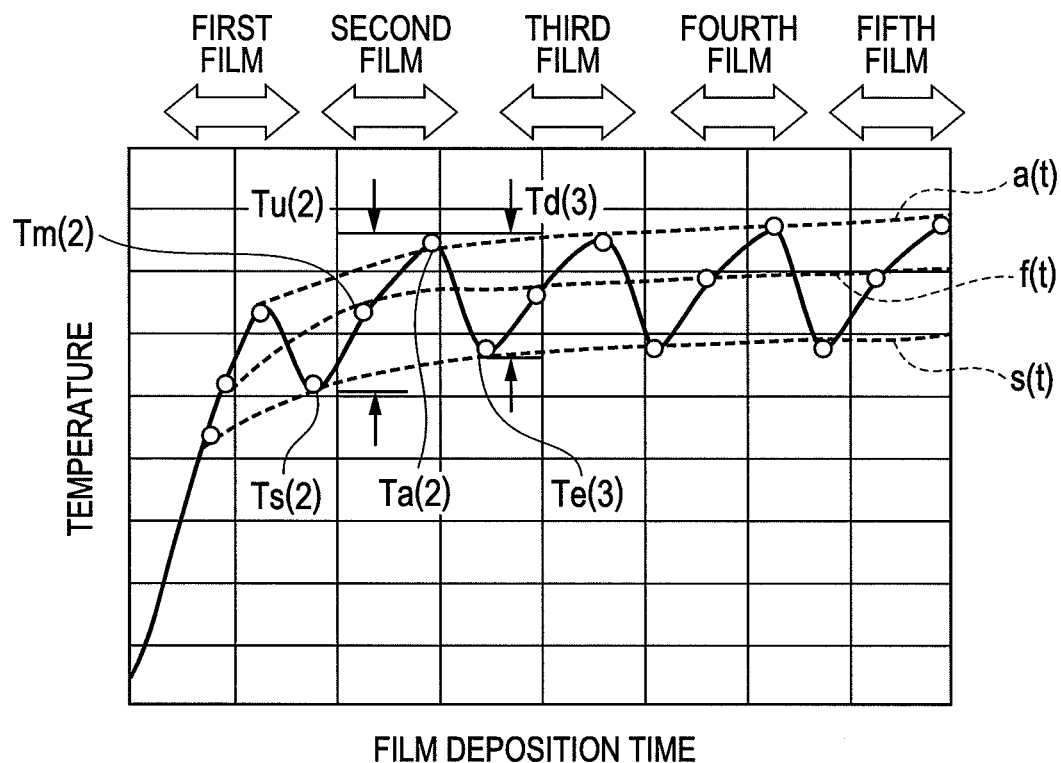
FIG. 6 is a diagram explaining a temperature estimation method in a fourth embodiment of the present invention.

While a reactive sputtering apparatus according to the fourth embodiment has approximately the same configuration as that according to the first embodiment, the operation of a reactive gas control mechanism 209 is different and especially a temperature estimation operation is different. FIG. 5 is an operation flow of the reactive gas control mechanism 209 in the present embodiment, and FIG. 6 is a diagram showing an image of temperature transition during the continuous film deposition processing for explaining the temperature estimation method.

The present embodiment shows a calculation method of shield temperature estimation value effectively applied for a case such as one in which a target flow rate of the reactive gas keeps a predetermined value without being changed during the substrate processing and the target flow rate is changed as required when the substrate is exchanged.

Specifically, shield temperature sampling is performed across plural times (e.g., before the film deposition processing and after the film deposition processing), and a shield temperature estimation value TM which is used for the calculation of a target flow rate for each time is calculated using a temperature increase amount Tu during the film deposition processing and a temperature decrease amount Td in the interim of the processing. That is, as shown in FIG. 6, the shield temperature estimation value TM is calculated using a temperature increase function when the temperature is increased by input heat from plasma during the film deposition and a temperature decrease function when the temperature falls along with substrate transfer and the like in the interim of the film deposition.

The operation flow shown in FIG. 5 is as follows. First the shield temperature is measured before the film deposition (e.g., after evacuation succeeding the substrate transfer is completed) (Step S102) and a film deposition start temperature Ts (x) is obtained (x: number of times of substrate processing). Then, a shield temperature estimation value TM is calculated (Step S103) and a target reactive gas flow rate is calculated using the calculated value, and then the reactive gas flow rate is adjusted to the value (Step S104). After the film deposition (e.g., after exhaustion before the carry-out of substrate is completed), a film deposition end temperature Te(x) is obtained (Step S106). The operations in Steps S101 to S107 are repeated until a predetermined number of times of the substrate processing are completed.

In Step S103, the shield temperature estimation value TM is calculated by following Formula (1) for the xth time substrate processing.

$$TM = Ts(x) + \frac{1}{2} \times Tu(x-1) \times Te(x)/Te(x-1) \qquad \text{Formula (1)}$$

where $Tu(x-1)$ is a temperature increase amount during the $(x-1)$th (previous) film deposition processing and $Te(x)$ is a temperature decrease amount from the end of the $(x-1)$th processing to the start of the xth processing.

In this manner, by adding both of the temperature increase function when the temperature is increased by the input heat of the plasma during the film deposition and the temperature decrease function when the temperature falls along with the substrate transfer and the like in the interim of the film deposition, it is possible to estimate the shield temperature accurately and calculate an appropriate reactive gas target flow rate using the estimated temperature, even in the continuous film deposition in which the temperature increase and the temperature decrease continue intermittently.

As other method, a shield temperature estimation value TM in a processing of the calculation target may be calculated based on an approximate function f(t) of a shield temperature measurement value Tm(x) at a certain processing time in each processing, for example. In this case, however, a temperature measurement value Tm(x−1) in the previous processing can be used for the estimation, for example, and the latest temperature information cannot be reflected. On the other hand, the method using the temperature decrease amount in the interim of the film deposition can reflect the information before the current film deposition which is the latest information, and the shield temperature estimation value TM can be calculated accurately.

Note that the calculation formula of the shield temperature estimation value TM is not limited to above Formula (1). For example, the temperature increase function and the temperature decrease function may be not only functions for temperature changes in a temperature increase time zone and a temperature decrease time zone such as a temperature increase amount and a temperature decrease amount but also functions or approximate functions, s(t) or e(t), for the shield temperatures at certain times, for example, in the temperature increase time zone and the temperature decrease time zone, respectively. Further, the estimation method using the temperature increase function and the temperature decrease function may be used during some time after the start of the continuous film deposition, for example, in which the temperature rises quickly, and the estimation method may be changed using the above f(t), for example, after the state is stabilized.

(Production Method)

Figure 7:
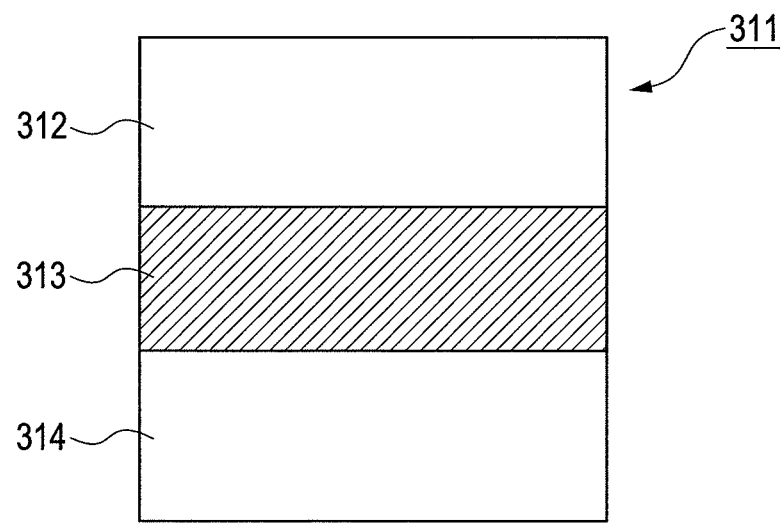
FIG. 7 is a schematic diagram showing a cross-sectional structure of a ReRAM according to an embodiment of the present invention.
Figure 8:
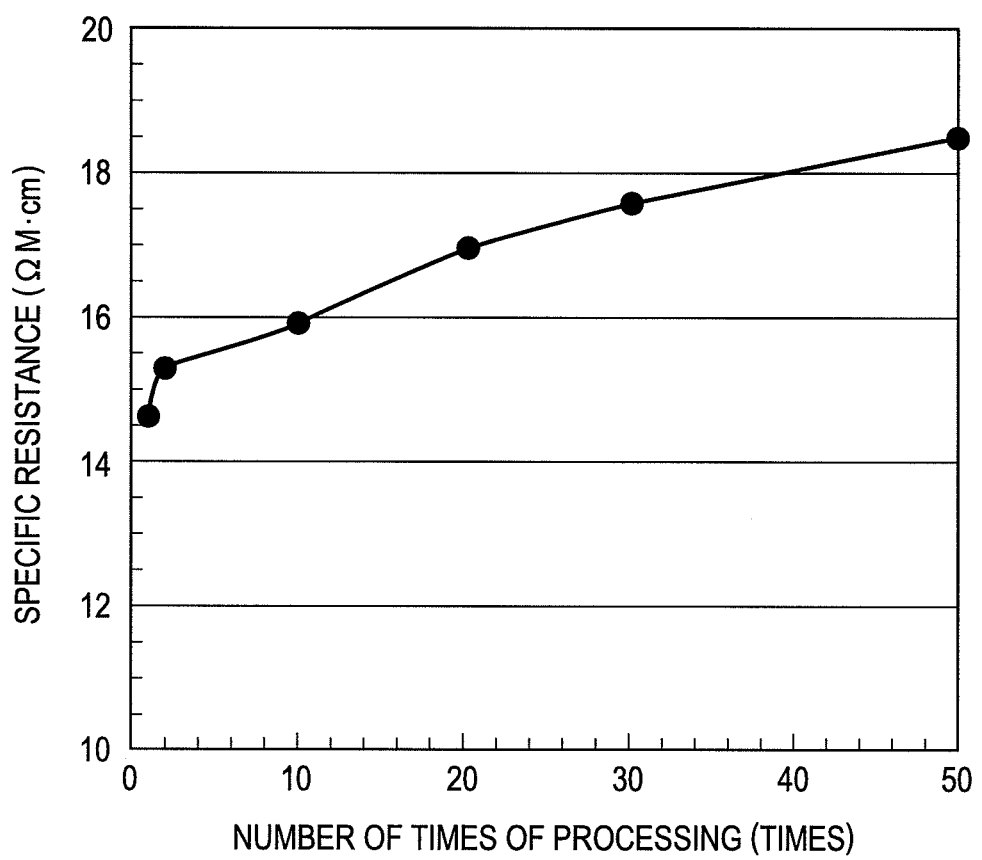
FIG. 8 is a graph showing a relationship between the number of times of processing and a specific resistance.

FIG. 7 is a schematic diagram showing a cross-sectional structure of a ReRAM according to an embodiment of the present invention. A resistance change element (memory element) 311 of a typical ReRAM has a parallel plate type laminated structure in which a resistance change film (e.g., transition metal oxide film) 313 is sandwiched between a lower electrode 312 and an upper electrode 314. When a voltage is applied across the upper electrode 314 and the lower electrode 312, the electric resistance of the resistance change film 313 is changed and takes two different resistance states (reset state and set state). It is described that a material containing at least one kind of element selected from Pt, Ru, Ti, Al, Ta, Cu, W and Ni is used for an electrode material to be used for the ReRAM.

The operation mechanism of the resistance change element 311 is as follows. First a forming voltage is applied as an initial operation for enabling the transition between the two resistance states. The application of the forming voltage generates a state of forming a filament which becomes a current path in the resistance change film 313. After that, the filament generation state is changed by the application of an operation voltage (set voltage or reset voltage) and a set/reset operation, that is, write/erase operation is carried out. While the number of filaments is increased as an area of an operation region is increased in the resistance change element 311, the increase in the number of filaments causes a variation in reset current control and resultantly memory operation is varied. The resistance change element preferably has a smaller operation area not only from a requirement of a higher density but also for realizing a stable and highly reliable operation. In the conventional structure, however, the miniaturization is limited by a fabrication preciseness of a photolithography, as described above.

Further, APPLIED PHYSICS LETTERS 86, 093509 (2005) proposes a nonvolatile memory device having a resistance change layer of NiO and using upper and lower electrodes of Pt and describes that a current path called a filament is formed in the Ni oxide and resistance is changed. International electron devices meeting technical digest, 2008, p 293-p 296 also proposes a nonvolatile memory device having a resistance change layer of TaOx and using upper and lower electrodes of Pt, and describes that resistance is changed by the movement of an oxygen element in an interface layer between a Pt electrode and TaOx.

Further, a technique regarding a resistance change element using an electrode of titan nitride, which is an electrode material for easy etching processing, is drawing attention. Symposium on VLSI technology digest of technical papers, 2009, p 30-p 31 proposes a nonvolatile memory device using a lower electrode of Pt, a resistance change layer of HfOx or HfAlOx and an upper electrode of TiN, and describes that the variation of an operation voltage is suppressed by the use of HfAlOx as the resistance change layer. International electron devices meeting technical digest, 2008, p 297-p 300 also describes that the resistance change operation can be realized by a laminated structure of TiN/TiOx/HfOx/TiN fabricated from a laminated structure of TiN/Ti/HfO$_2$/TiN by annealing using oxygen.

For the resistance change film 313 of the resistance change element 311, there is used an oxide having a composition shifted from a stoichiometric one such as an insulating film having an oxygen defect, and the resistance change film 313 can be deposited by the reactive sputtering according to an embodiment of the present invention. That is, an advantage of the present invention can be obtained in the ReRAM fabrication process using the reactive puttering in which at least one of Ta, Ni, V, Zn, Nb, Ti, Co, W, Hf and Al is used for the deposition of the resistance change film 313.

Example 1

Table 1 shows a result of the continuous film deposition of the reactive sputtering for a case of controlling the oxygen flow rate in consideration of the shield temperature. Fifty times of film deposition were carried out under the following condition.

Film deposition condition:
- Target: Ta
- Target input power: DC 1000 W
- Ar gas flow rate: 20 sccm
- Reactive gas: Oxygen
- Pressure during film deposition: 0.06 Pa
- Evaluation substrate: Si substrate with a thermally-oxidized film
- Film thickness: 30 nm
- Specific resistance: approximately 20 mohm·cm Film depositions of an example and a comparison example were carried out under the above condition and the oxygen flow rate for the comparison example sample was kept constant during the deposition while the oxygen flow rate was controlled according to the shield temperature for the example.

From the result, it was confirmed that the variation of the specific resistance could be suppressed to approximately 2% from the first film to the 50th film.

TABLE 1

| Sample | Shield temperature (° C.) | Reactive gas flow rate (sccm) | Value normalized by a specific resistance of the first film |
|---|---|---|---|
| Example (first film) | 28 | 23 | 1.00 |
| Example (50th film) | 37 | 22 | 1.02 |
| Comparison example (first film) | 28 | 23 | 1.00 |
| Comparison example (50th film) | 37 | 23 | 1.26 |

What is claimed is:

1. A sputtering apparatus forming a deposited film on a to-be-processed substrate by sputtering, the apparatus comprising:
    a container;
    an electrode that is provided in the container and to which a target can be attached;
    a substrate holder that is provided in the container and can hold the to-be-processed substrate;
    a gas introduction means for introducing reactive gas into the container;
    a radiation thermometer that measures a temperature of a member facing a sputtering space formed between the electrode and the substrate holder;
    a shield plate that is provided between the substrate holder and the electrode and has an opening through which sputtered particles from the target can pass; and
    a controller controlling the gas introduction means so as to reduce a flow rate of the reactive gas supplied into the container according to a rise in the temperature of the member measured by the radiation thermometer,
    wherein the shield plate is configured to switch between a first state where the electrode is exposed to the sputtering space through the opening at a same time as the radiation thermometer is shielded from the sputtering space and a second state where the radiation thermometer is exposed to the sputtering space through the opening at a same time as the electrode is shielded from the sputtering space.

2. The sputtering apparatus according to claim 1, wherein the radiation thermometer is provided on an inner surface of the container and on an opposite side of the substrate holder with respect to the shield plate.

* * * * *